United States Patent
Cha

(10) Patent No.: US 9,496,135 B2
(45) Date of Patent: Nov. 15, 2016

(54) EPITAXIAL SILICON WAFER AND METHOD FOR FABRICATING THE SAME

(75) Inventor: Han-Seob Cha, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 922 days.

(21) Appl. No.: 11/730,885

(22) Filed: Apr. 4, 2007

(65) Prior Publication Data

US 2007/0298591 A1 Dec. 27, 2007

(30) Foreign Application Priority Data

Jun. 27, 2006 (KR) ................. 10-2006-0058126

(51) Int. Cl.
*H01L 21/02* (2006.01)
*H01L 29/66* (2006.01)

(52) U.S. Cl.
CPC ..... *H01L 21/02532* (2013.01); *H01L 21/0245* (2013.01); *H01L 21/0262* (2013.01); *H01L 21/02573* (2013.01); *H01L 29/66825* (2013.01)

(58) Field of Classification Search
CPC .............. H01L 21/0254; H01L 21/02532; H01L 21/02573; H01L 21/024
USPC ......... 438/495, 499, 501, 505, 508; 257/655
See application file for complete search history.

(56) References Cited

U.S. PATENT DOCUMENTS

| | | | | |
|---|---|---|---|---|
| 3,628,137 A * | 12/1971 | Mazur | ............... | 324/717 |
| 3,847,686 A * | 11/1974 | Stein | ............... | 117/90 |
| 4,799,991 A * | 1/1989 | Dockrey | ............... | 438/719 |
| 4,875,086 A * | 10/1989 | Malhi et al. | ............... | 257/506 |
| 4,927,781 A * | 5/1990 | Miller | ............... | 438/500 |
| 5,134,082 A * | 7/1992 | Kirchgessner | ........ | H01L 21/763 438/207 |
| 5,405,803 A * | 4/1995 | Kusaka | ............... | 438/506 |
| 5,622,880 A * | 4/1997 | Burr et al. | ............. | H01L 29/10 438/194 |
| 6,395,611 B1* | 5/2002 | Belk et al. | ............... | 438/381 |
| 6,437,375 B1* | 8/2002 | Beaman | ............... | 257/192 |
| 6,525,351 B2* | 2/2003 | Yoshida | ............... | 257/229 |
| 6,750,119 B2* | 6/2004 | Chu et al. | ............... | 438/479 |
| 7,274,051 B2* | 9/2007 | Kim et al. | ............... | 257/213 |
| 7,449,712 B2* | 11/2008 | Cha | ............... | 257/19 |
| 2004/0185640 A1 | 9/2004 | Cardone et al. | | |
| 2005/0118746 A1* | 6/2005 | Sumakeris et al. | ........... | 438/105 |

FOREIGN PATENT DOCUMENTS

JP 06151864 A 5/1994

(Continued)

OTHER PUBLICATIONS

Irvin, "Resistivity of Bulk Silicon and of Diffused Layers in Silicon", The Bell System Technical Journal, vol. 41, No. 2, Mar. 1962, pp. 387-410.*

(Continued)

*Primary Examiner* — Stephen W Smoot
*Assistant Examiner* — Sun M Kim

(57) ABSTRACT

An epitaxial silicon wafer includes a bulk wafer having a first doping concentration, a first epitaxial layer formed over the bulk wafer, the first epitaxial layer having a second doping concentration which is higher than the first doping concentration, and a second epitaxial layer formed over the first epitaxial layer, the second epitaxial layer having a third doping concentration which is lower than the second doping concentration.

7 Claims, 1 Drawing Sheet

(56) References Cited

FOREIGN PATENT DOCUMENTS

| JP | 2000-332223 | 11/2000 |
|----|-------------|---------|
| KR | 1999-006451 | 1/1999 |
| KR | 2001-0089391 | 10/2001 |
| KR | 2006-0069249 | 6/2006 |

OTHER PUBLICATIONS

Wolf, Stanley, et al., "Silicon Processing for the VLSI Era vol. 1: Process Technology." *Lattice Press*, 2000 (4 pages, in English).
Wolf, Stanley, "Silicon Processing for the VLSI Era, vol. 4: Deep Submicron Process Technology." *Lattice Press*, 2002 (7 pages, in English).

* cited by examiner

EPITAXIAL SILICON WAFER AND METHOD FOR FABRICATING THE SAME

CROSS-REFERENCE TO RELATED APPLICATIONS

The present invention claims priority of Korean patent application number 10-2006-0058126, filed on Jun. 27, 2006, which is incorporated by reference in its entirety.

BACKGROUND OF THE INVENTION

The present invention relates to a method for fabricating a semiconductor device, and more particularly, to a method for fabricating a silicon wafer. In more detail, the present invention relates to an epitaxial silicon wafer and a method for fabricating the same.

Silicon, generally used as a wafer material, is an element naturally occupying approximately 28% of the surface of the earth. Silicon exists in forms of an oxidized substance (quartzite) or a silicate. Powder form silicon of approximately 98% purity, often referred to as metalloid silicon, may be obtained by melting quartzite, which is the chief element of silica, with coke in an electric furnace and then performing a chemical treatment. Polycrystalline silicon of approximately 99% purity may be obtained by transforming the powder form silicon into gas form silicon and then performing a thermal treatment. Since the silicon wafer used during an integrated circuit fabrication is generally required to be mono-crystalline, the polycrystalline silicon is transformed into the mono-crystalline silicon using a physical refining method. The czochralski method is a general method for transforming the polycrystalline silicon into the mono-crystalline silicon.

The czochralski method is briefly described below. A high-purity silicon melted solution in a silica melting pot is maintained at a temperature slightly higher than the melting point by a high frequency inductive heating. In order to grow the mono-crystalline silicon, a piece of mono-crystalline silicon, generally referred to as a seed-crystal, at an upper portion of a shaft is brought in contact with a surface of the liquid, and the shaft is pulled upward while rotating at a speed of approximately 50 mm to 100 mm per hour. The silicon solution grows with the same crystal orientation as the seed crystal, forming a cylinder type silicon mass referred to as an ingot.

The cylinder type ingot grown by the czochralski method is thinly cut in a shape of a disc using a cutter, and the surface is then polished using a chemical mechanical method to form a thin wafer. At this time, the type of the wafer is determined by the type and amount of added impurities. The wafer becomes an N-type wafer if N-type impurities are added such as phosphorus (P) or arsenic (As) which are materials of the group 5 in the periodic table. The wafer becomes a P-type wafer if P-type impurities are added such as boron (B) which is a material of the group 3 of the periodic table. The impurities may be evenly distributed over the entire silicon wafer. A resistance value of the substrate depends on the concentration of the impurities.

Meanwhile, a process for forming another high-purity crystalline layer according to the crystal orientation at the surface of the mono-crystalline silicon wafer grown by the czochralski method is referred to as an epitaxial growth method or an epitaxial method. The layer formed using the epitaxial method is referred to as an epitaxial layer or an epi-layer.

The epitaxial method is performed in two steps while the silicon wafer is loaded into a deposition chamber and on a susceptor. The first step includes pre-baking by supplying a cleaning gas such as a mixed gas of hydrogen or hydrogen/hydrogen chloride acid at a temperature of approximately 1,150° C. on the surface of the silicon wafer, and then cleaning the surface of the silicon wafer. Native oxide formed over the surface of the silicon wafer is substantially removed in a manner that an epitaxial silicon layer evenly grows continuously over the surface. The second step includes supplying a silicon vapor source such as silane or trichlorosilane on the surface of the silicon wafer at a temperature of approximately 1,000° C. or higher to form and epitaxially grow a silicon layer over the surface.

The epitaxial silicon layer grown by the epitaxial method has the following limitation. While the pre-baking at a high temperature and the epitaxial growth method are performed, impurity atoms such as boron or phosphorus are discharged through the other side of the silicon wafer. To reduce the discharge of the impurity atoms, impurities are implanted into the mono-crystalline silicon wafer grown by the czochralski method, and the other side of the mono-crystalline silicon wafer is sealed by an oxide layer or a polysilicon layer using a chemical mechanical deposition (CVD) method. Such process is referred to as a back seal process, and the resulting layer is referred to as a back seal layer.

Accordingly, the wafer fabrication cost may increase during the typical epitaxial silicon wafer fabrication method because the back seal layer is generally required to be formed on the other side of the mono-crystalline silicon wafer highly doped by the back seal process, that is, a bulk wafer.

SUMMARY OF THE INVENTION

Embodiments of the present invention are directed to provide an epitaxial silicon wafer and a method for fabricating the same, which can decrease wafer fabrication costs.

In accordance with an aspect of the present invention, there is provided an epitaxial silicon wafer, including: a bulk wafer having a first doping concentration; a first epitaxial layer formed over the bulk wafer, the first epitaxial layer having a second doping concentration which is higher than the first doping concentration; and a second epitaxial layer formed over the first epitaxial layer, the second epitaxial layer having a third doping concentration which is lower than the second doping concentration.

In accordance with another aspect of the present invention, there is provided a method for fabricating an epitaxial silicon wafer, including: forming a bulk wafer having a first doping concentration; forming a first epitaxial layer over the bulk wafer, the first epitaxial layer having a second doping concentration which is higher than the first doping concentration; and forming a second epitaxial layer over the first epitaxial layer, the second epitaxial layer having a third doping concentration which is lower than the second doping concentration.

DESCRIPTION OF SPECIFIC EMBODIMENTS

The present invention relates to an epitaxial silicon wafer and a method for fabricating the same. According to this invention, the fabrication cost of an epitaxial silicon wafer may be decreased by using a lowly doped bulk wafer to omit a back seal process.

Figure 1:
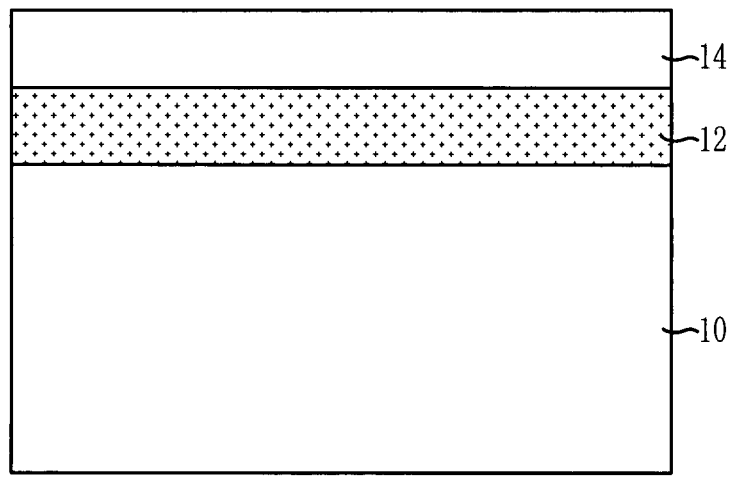
FIG. 1 illustrates a cross-sectional view of an epitaxial silicon wafer according to a first embodiment of the present invention.

FIG. 1 illustrates a cross-sectional view of an epitaxial silicon wafer according to a first embodiment of the present invention. The epitaxial silicon wafer according to the first embodiment of the present invention includes a lowly doped bulk wafer 10, a highly doped epitaxial layer 12 formed over the lowly doped bulk wafer 10, and a lowly doped epitaxial layer 14 formed over the highly doped epitaxial layer 12.

The lowly doped bulk wafer 10 may include a bulk wafer with a resistivity ranging from approximately 1 $\Omega$·cm to approximately 50 $\Omega$·cm. In particular, the lowly doped bulk wafer 10 may include a bulk wafer with a resistivity ranging from approximately 10 {fourth root}·cm to approximately 20 $\Omega$·cm. For instance, the lowly doped bulk wafer 10 may include one selected from a group consisting of a reclaimed wafer, a test wafer, and a prime wafer. The cost for each of the reclaimed wafer, the test wafer, and the prime wafer may be approximately $10, $20, and $30, respectively. The lowly doped bulk wafer 10 may include an N-type wafer, a P-type wafer, or an intrinsic wafer.

The highly doped epitaxial layer 12 has a doping concentration with a resistivity ranging from approximately $10^{-5}$ $\Omega$·cm to approximately $10^{-1}$ $\Omega$·cm. The highly doped epitaxial layer 12 may be N-type or P-type. The highly doped epitaxial layer 12 is formed at a temperature ranging from approximately 900° C. to approximately 1,200° C. with a pressure ranging from approximately 10 Torr to approximately 760 Torr using a silicon source gas of silicon hydride ($SiH_4$), dichlorosilane (DCS), or trichlorosilane (TCS). However, the silicon source gas is not limited to the aforementioned ones. Most types of silicon source gas may be used. An additive gas added for determining a conductivity type may include diborane ($B_2H_6$) for the P-type, and arsine ($AsH_3$) or phosphine ($PH_3$) for the N-type.

The lowly doped epitaxial layer 14 has a doping concentration with a resistivity higher than that of the highly doped epitaxial layer 12. The lowly doped epitaxial layer 14 may have the doping concentration with the resistivity ranging from approximately 1 $\Omega$·cm to approximately 50 $\Omega$·cm. The lowly doped epitaxial layer 14 may be N-type, P-type, or intrinsic. The lowly doped epitaxial layer 14 may be formed in-situ with the fabrication process of the highly doped epitaxial layer 12. The lowly doped epitaxial layer 14 is formed under substantially the same conditions of temperature, pressure, source gas, and additive gas as those used in fabricating the highly doped epitaxial layer 12. However, the amount of the source gas supplied during the fabrication of the lowly doped epitaxial layer 14 is different from that supplied during the fabrication of the highly doped epitaxial layer 12 such that the doping concentrations may be different.

As described above, the epitaxial silicon wafer according to the first embodiment of the present invention may not require a typical back seal layer formed through a typical back seal process because the epitaxial silicon wafer according to the first embodiment uses the bulk wafer 10 including a wafer with a resistivity ranging from approximately 1 $\Omega$·cm to approximately 50 $\Omega$·cm. Thus, the fabrication cost may be reduced.

In more detail, a typical epitaxial layer may be formed at a high temperature of approximately 1,000° C. or higher. At this time, the epitaxial layer is grown over a bulk wafer highly doped with a resistivity ranging from approximately $10^{-2}$ $\Omega$·cm to approximately $10^{-3}$ $\Omega$·cm. Thus, boron or phosphorus implanted in the bulk wafer moves toward the edges by the high temperature, doping edge regions of the wafer. Consequently, a resistance of the edge regions of the wafer changes, resulting in an uneven resistance characteristic over the wafer. Thus, a back seal process is performed to reduce such resistance characteristic change. That is, the back seal process reduces discharging of the boron or the phosphorus through a back surface of the bulk wafer. At this time, the boron or the phosphorus may not be discharged through a front surface of the bulk wafer because the epitaxial layer is grown over the front surface.

On the contrary, the epitaxial silicon wafer according to the first embodiment of the present invention may not require the typical back seal process because the epitaxial silicon wafer according to the first embodiment uses the lowly doped bulk wafer 10 with the resistivity ranging from approximately 1 $\Omega$·cm to approximately 50 $\Omega$·cm. That is, according to the first embodiment of the present invention, the amount of boron or phosphorus being discharged through the back surface of the wafer during the epitaxial growth process may be a negligible quantity because the bulk wafer used in the first embodiment is lowly doped when compared to the typical process. Thus, the fabrication cost may decrease because the typical back seal process may not be required.

Figure 2:
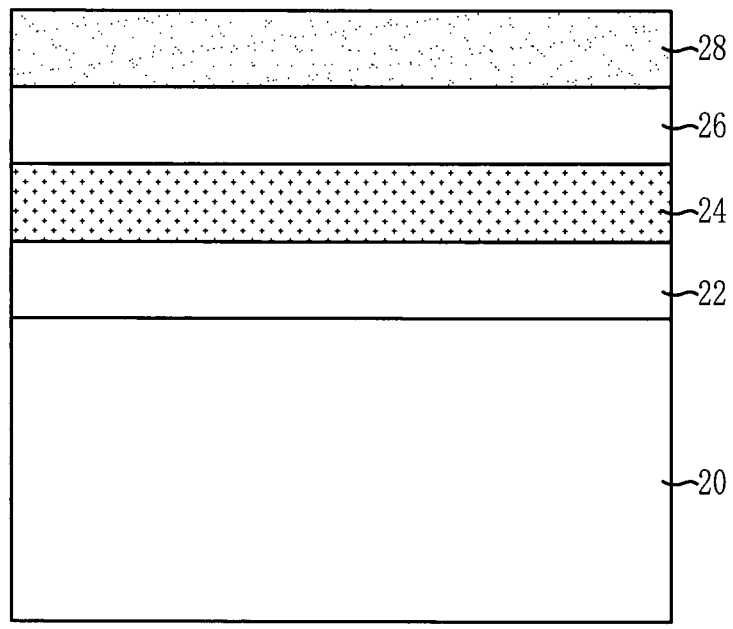
FIG. 2 illustrates a cross-sectional view of an epitaxial silicon wafer according to a second embodiment of the present invention.

FIG. 2 illustrates a cross-sectional view of an epitaxial silicon wafer according to a second embodiment of the present invention. The epitaxial silicon wafer according to the second embodiment uses a lowly doped bulk wafer 20, similar to the first embodiment. However, the epitaxial silicon wafer further includes a first inter-layer 22 and a second inter-layer 26 formed between the lowly doped bulk wafer 20 and a highly doped epitaxial layer 24, and between the highly doped epitaxial layer 24 and a lowly doped epitaxial layer 28, respectively.

The first and second inter-layers 22 and 26 are formed using an epitaxial method, like the highly doped epitaxial layer 24 and the lowly doped epitaxial layer 28. For instance, the second inter-layer 26 is formed by growing the highly doped epitaxial layer 24. The first and second inter-layers 22 and 26, the highly doped epitaxial layer 24, and the lowly doped epitaxial layer 28 are formed under substantially the same conditions regarding temperature, pressure, source gas, and additive gas. However, amounts of the source gas supplied during the fabrications of the above layers may be different from each other such that different doping concentrations may be obtained. The first and second inter-layers 22 and 26 may be formed to have a conductivity type substantially the same as or different from those of the highly doped epitaxial layer 24 and the lowly doped epitaxial layer 28, while having different concentrations from the highly doped epitaxial layer 24 and the lowly doped epitaxial layer 28. The first and second inter-layers 22 and 26 may be formed with doping concentrations substantially the same as or different from each other. The first and second inter-layers 22 and 26 may be formed with substantially the same concentration as the bulk wafer 20 or with a concentration higher than the bulk wafer 20 in some cases. The first and second inter-layers 22 and 26 may be N-type, P-type, or intrinsic. Also, the first and second inter-layers 22 and 26 may include a plurality of layers.

The lowly doped bulk wafer 20 includes a bulk wafer with a resistivity ranging from approximately 1 $\Omega$·cm to approximately 50 $\Omega$·cm, like the lowly doped bulk wafer 10 according to the first embodiment. For instance, the lowly doped bulk wafer 20 may be formed by implanting impurities in one selected from a group consisting of a reclaimed wafer, a test wafer, and a prime wafer. Also, the lowly doped bulk wafer 20 may include an N-type wafer, a P-type wafer, or an intrinsic wafer.

The highly doped epitaxial layer 24 has a doping concentration with a resistivity ranging from approximately $10^{-5}$ Ω·cm to approximately $10^{-1}$ Ω·cm, like the highly doped epitaxial layer 12 according to the first embodiment. The highly doped epitaxial layer 24 may be N-type or P-type. The highly doped epitaxial layer 24 is formed at a temperature ranging from approximately 900° C. to approximately 1,200° C. with a pressure ranging from approximately 10 Torr to approximately 760 Torr using a silicon source gas of $SiH_4$, DCS, or TCS. However, the silicon source gas is not limited to the aforementioned ones. Most types of silicon source gas may be used. An additive gas added for determining a conductivity type may include $B_2H_6$ for the P-type, and $AsH_3$ or $PH_3$ for the N-type.

The lowly doped epitaxial layer 28 may have a doping concentration with a resistivity ranging from approximately 1 Ω·cm to approximately 50 Ω·cm, like the lowly doped epitaxial layer 14 in the first embodiment. The lowly doped epitaxial layer 28 may be N-type, P-type, or intrinsic. The lowly doped epitaxial layer 28 may be formed in-situ with the fabrication process of the highly doped epitaxial layer 24. The lowly doped epitaxial layer 28 is formed under substantially the same conditions regarding temperature, pressure, source gas, and additive gas as those used in fabricating the highly doped epitaxial layer 24. However, the amount of the source gas supplied during the fabrication of the lowly doped epitaxial layer 28 is different from that supplied during the fabrication of the highly doped epitaxial layer 24 such that the doping concentrations may be different.

Meanwhile, the highly doped epitaxial layers and the lowly doped epitaxial layers described in the first and second embodiments may be formed using a low plasma chemical vapor deposition (LPCVD) apparatus, an ultra high vacuum chemical vapor deposition (UHVCVD) apparatus, or a remote plasma chemical vapor deposition (RPCVD) apparatus. Furthermore, the epitaxial silicon wafers fabricated in accordance with the first and second embodiments of the present invention may be used in a charge coupled device (CCD), a complementary metal-oxide semiconductor (CMOS) image sensor (CIS), and a liquid crystal display (LCD) driver IC (LDI), as well as in various system ICs, dynamic random access memories (DRAM), and flash memory devices.

While the present invention has been described with respect to the specific embodiments, it will be apparent to those skilled in the art that various changes and modifications may be made without departing from the spirit and scope of the invention as defined in the following claims.

What is claimed is:

1. An epitaxial silicon wafer comprising:
   a doped bulk wafer;
   a first inter-layer formed directly on the doped bulk wafer;
   a first epitaxial layer formed directly on the first inter-layer, the first epitaxial layer having a doping concentration higher than that of the doped bulk wafer;
   a second inter-layer formed directly on the first epitaxial layer; and
   a second epitaxial layer formed directly on the second inter-layer, and the second epitaxial layer having a doping concentration less than that of the first epitaxial layer,
   wherein the bulk wafer, the first inter-layer, the first epitaxial layer, the second inter-layer, and the second epitaxial layer have a same conductivity type,
   wherein both the first inter-layer and the second inter-layer have a different concentration from the first epitaxial layer and the second epitaxial layer, and
   wherein both the first inter-layer and the second inter-layer have a concentration higher than that of the doped bulk wafer.

2. The epitaxial silicon wafer of claim 1, wherein the doped bulk wafer has a resistivity ranging from approximately 1 Ω·cm to 50 Ω·cm.

3. The epitaxial silicon wafer of claim 1, wherein the first epitaxial layer has a resistivity ranging from approximately 10-5 Ω·cm to 10-1 Ω·cm.

4. The epitaxial silicon wafer of claim 1, wherein the second epitaxial layer has a resistivity ranging from approximately 1 Ω·cm to 50 Ω·cm.

5. The epitaxial silicon wafer of claim 1, wherein the same conductivity is N-type or P-type.

6. The epitaxial silicon wafer of claim 5, wherein the first epitaxial layer and the second epitaxial layer are formed using one selected from a group consisting of Boron, Arsenic, and Phosphorous.

7. The epitaxial silicon wafer of claim 1, wherein both the first inter-layer and the second inter-layer are epitaxial layer.

* * * * *